United States Patent
Kang et al.

(10) Patent No.: US 7,450,455 B2
(45) Date of Patent: Nov. 11, 2008

(54) SEMICONDUCTOR MEMORY DEVICE AND DRIVING METHOD THEREOF

(75) Inventors: Sang-Hee Kang, Kyoungki-do (KR); Hi-Hyun Han, Kyoungki-do (KR); Ho-Youb Cho, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/529,570

(22) Filed: Sep. 29, 2006

(65) Prior Publication Data

US 2007/0076501 A1      Apr. 5, 2007

(30) Foreign Application Priority Data

Sep. 29, 2005    (KR) .............. 10-2005-0091685
Jun. 2, 2006     (KR) .............. 10-2006-0050041

(51) Int. Cl.
    *G11C 11/00* (2006.01)
(52) U.S. Cl. ......................... 365/208; 365/205
(58) Field of Classification Search ................. 365/208, 365/205
    See application file for complete search history.

(56) References Cited

U.S. PATENT DOCUMENTS

| | | | |
|---|---|---|---|
| 4,694,205 A * | 9/1987 | Shu et al. ..................... 327/53 |
| 4,816,706 A * | 3/1989 | Dhong et al. .................. 327/57 |
| 5,777,939 A * | 7/1998 | Won ............................ 365/222 |
| 6,735,134 B2 | 5/2004 | Park |
| 2004/0136254 A1* | 7/2004 | Regev ......................... 365/205 |
| 2004/0233754 A1* | 11/2004 | Kwon .......................... 365/205 |
| 2004/0264277 A1* | 12/2004 | Song ........................... 365/205 |

FOREIGN PATENT DOCUMENTS

| | | |
|---|---|---|
| JP | 2003-123473 | 4/2003 |
| KR | 1996-0012019 | 4/1996 |
| KR | 10-2002-0058505 A | 7/2002 |
| KR | 10-2004-0038067 A | 5/2004 |
| KR | 10-2005-0097153 | 10/2005 |

* cited by examiner

*Primary Examiner*—Michael T Tran
(74) *Attorney, Agent, or Firm*—McDermott Will & Emery LLP

(57) ABSTRACT

A semiconductor memory device prevents deterioration of refresh operation caused by sensing noise and a driving method thereof. First pull-down and second pull-down voltages which are different from each other are as a pull-down voltage of a bit line sense amplifier. The first and the second pull-down voltages are used in different driving periods to protect data from noises caused by another memory bank. A driving period can be separated into an initial sensing period, wherein large currents are consumed and significant noise is generated, and a subsequent stable period. The driving period can be separated into a pre-precharge period and a post-precharge period.

17 Claims, 14 Drawing Sheets

SEMICONDUCTOR MEMORY DEVICE AND DRIVING METHOD THEREOF

FIELD OF THE INVENTION

The present invention relates to a semiconductor memory device; and, more particularly, to a scheme controlling a bit line sense amplifier of the semiconductor memory device.

DESCRIPTION OF RELATED ARTS

Scaling down of line width and cell size of a semiconductor memory chip proceeds continuously. Accordingly, as an external supply voltage VDD becomes low, modification of the architecture of the semiconductor memory device operating under low-power system is required.

Most semiconductor memory chips are provided with an internal voltage generating circuit generating internal voltage from the external supply voltage VDD and supplied with a predetermined voltage required by internal circuits therein. Particularly, in a semiconductor memory device including a bit line sense amplifier such as a DRAM, a core voltage VCORE is used for sensing cell data. The core voltage VCORE has a voltage level corresponding to a digital data '1'.

When a word line selected by a low address is activated, data stored in a plurality of memory cells connected to the word line are respectively transmitted to plural bit line pairs. Bit line sense amplifiers, each coupled to a respective bit line pair, sense and amplify a voltage difference between a bit line and a bit line bar of each bit line pair. If thousands of bit line sense amplifiers operate, a large amount of current is consumed when the core voltage VCORE is supplied to a pull-up supply line, so-called RTO line, coupled to plural bit line sense amplifiers. As the level of the core voltage VCORE is lower with the trend of lower external supply voltage VDD, amplifying a large amount of cell data rapidly using the core voltage VCORE can cause overload.

A method of over-driving a bit line sense amplifier is used to solve the problem. The over-driving method drives the RTO line of the bit line sense amplifier with a higher voltage than the core voltage VCORE, usually the VDD at an initial operation of the bit line sense amplifier, after data stored in the memory cell is transmitted to the bit line pair.

FIG. 1 is a block diagram of a conventional DRAM core performing an over-driving operation.

Referring to FIG. 1, the DRAM core includes a memory cell 400, a bit line sense amplifier 300, a supply line driver 200 and a sense amplifier controller 100, whether performing over-driving operation or not.

Though not shown in FIG. 1, a bit line divider, a bit line equalizer/precharger and a column selector are coupled to the bit line sense amplifier 300.

The memory cell 400 includes a first NMOS transistor N1 and a capacitor C1. The first NMOS transistor N1, connected between a bit line BL or a bit line bar BLB and a storage node SN, has a gate connected in a word line WL. The capacitor C1 is connected between the storage node SN and a cell plate voltage VCP.

The bit line sense amplifier 300 has a latch structure wherein two pull-up PMOS transistors P3 and P4 are cross connected with two pull-down NMOS transistors N2 and N3. On the other side, the two pull-up PMOS transistors P3 and P4 are connected with the RTO line. And the two pull-down NMOS transistors N2 and N3 are connected with a pull-down supply line, so-called SB line. When a predetermined voltage is supplied to the SB and RTO lines in response to an enable signal, the bit line sense amplifier senses a fine voltage difference between both the bit line BL and the bit line bar BLB having charges in common. The bit line sense amplifier amplifies one of the bit line pair to a ground voltage VSS level and the other of the bit line pair to the core voltage VCORE level.

The supply line driver 200 includes a first PMOS transistor P1 for an over-driving operation and PMOS and NMOS transistors P2 and N4 for a normal-driving operation. The first PMOS transistor P1 supplies the RTO line with the external supply voltage VDD in the response to a first RTO line driving signal SAP1B. The second PMOS transistor P2 supplies the RTO line with the core voltage VCORE in the response to a second RTO line driving signal SAP2B. The fourth NMOS transistor N4 supplies the SB line with the ground voltage VSS in the response to a SB line driving signal SAN.

FIG. 2 is a schematic circuit diagram of the sense amplifier controller 100 shown in FIG. 1.

As shown, the conventional controller 100 includes an first inverter IV0 receiving an active command signal ACT, a pull-up PMOS transistor P11 controlled by an output of the first inverter IV0, a pull-down NMOS transistor N11 controlled by a precharge command signal PCG, an inverter latch and a second delay 30. The inverter latch, containing sixth and seventh inverters IV5 and IV6, is connected between the pull-up transistor P11 and the pull-down transistor N11. The second delay 30 delays a falling edge of an output of the inverter latch by a second delay time tDelay2.

The conventional controller 100 further includes a falling pulse generator 10, a cross-coupled NAND latch consisting of first and second NAND gates ND1 and ND2, a first delay 20 and inverters IV1 to IV4. The falling pulse generator 10 generates a pulse in response to a falling edge of a signal A_sig, an output of the second delay 30. The cross-coupled NAND latch receives an output of the falling pulse generator 10 as a set signal and an output of the fifth inverter IV4 as a reset signal. The first delay 20 delays an output of the cross-coupled NAND latch by a first delay time tDelay1. The fifth inverter IV4 inverts an output of the first delay 20. The second inverter IV1 receives an output of the cross-coupled NAND latch and the third inverter IV2 receives a signal C_sig, an output of the second inverter IV1. The fourth inverter IV3 receives an output of the third inverter IV2 and outputs the first RTO line driving signal SAP1B.

In addition, the conventional controller 100 includes third and fourth delays 40 and 50, three inverters IV7 to IV9, a third NAND gate ND3 and an inverter chine consisting of inverters IV10 to IV12. The third delay 40 delays a rising edge of the signal A_sig by a third delay time tDelay3. The fourth delay 50 delays a falling edge of a signal B_sig, an output of the third delay 40 by a fourth delay time tDelay4. The eighth inverter IV7 receives an output of the fourth delay 50. The third NAND gate ND3 receives a signal D_sig, an output of the eighth inverter IV7 and the signal C_sig. The ninth inverter IV8 receives an output of the third NAND gate ND3. The tenth inverter IV9 receives an output of the ninth inverter IV8 and outputs the second RTO line driving signal SAP2B. The delay chain receives the signal B_sig and outputs the SB line driving signal SAN.

FIG. 3 is a timing diagram for illustrating an operation of the sense amplifier controller 100 shown in FIG. 2.

As shown, an output of the inverter latch falls in response to activation of the active command signal ACT and rises in response to activation of the precharge command signal PCG.

The second delay 30 delays a falling edge of the output of the inverter latch and outputs the signal A_sig delayed from the activation of the active command signal ACT by the second delay time tDelay2. The third delay 40 delays a rising edge of the signal A_sig and outputs the signal B_sig delayed from the activation of the precharge command signal PCG by the third delay time tDelay3.

The falling pulse generator 10, the first delay 20, the first and the fourth inverters IV1 and IV4 and the cross-coupled NAND latch output the signal C_sig having tDelay1 time window from a falling edge of the signal A_sig.

The fourth delay 50 and the seventh inverter IV7 output the signal D_sig by inverting after delaying a falling edge of the signal B_sig by the fourth delay time tDelay4. The signal D is transited within the tDelay1 time window of the output C (tDelay1>tDelay4).

The first RTO line driving signal SAP1B represents an over-driving period which continues for the first delay time tDelay1 after delayed from an active point as the second delay time tDelay2. The second RTO line driving signal SAP2B represents a normal-driving period which continues from non-activation of the first RTO line driving signal SAP1B to the point delayed from a precharge point by the third delay time tDelay3. The SB line driving signal SAN is activated to high logic level during the over-driving operation and the normal-driving operation responsive to the first and the second RTO line driving signals SAP1B and SAP2B. Delay times by logic gates are not considered to simplify understanding.

FIG. 4 is a timing diagram for illustrating an operation of the conventional DRAM core shown in FIG. 1.

When the active command is input and the word line WL is enabled, the storage node SN and the bit line are coupled. There is a fine voltage difference between the bit line BL and the bit line bar BLB.

Continuously, in the event that the bit line sense amplifier 300 is enabled, the over-driving PMOS transistor P1 and the normal-driving PMOS/NMOS transistors P2/N4 drive the RTO line and the SB line with the first and the second RTO line driving signals SAP1B/SAP2B and the SB line driving signal SAN.

After data amplified through the over-driving and the normal-driving operations are rewritten, the word line WL and the bit line sense amplifier 300 are disabled when the precharge command is input. The bit line pair BL and BLB is equalized/precharged to half of the core voltage VCORE.

FIG. 5 is a waveform for illustrating sensing noise occurring in the conventional DDR core.

In the conventional DDR core, all banks are supplied with the pull-up/pull-down voltages of the bit line sense amplifier 300 in common. That is, all banks use the core voltage VCORE and the ground voltage VSS in common. Accordingly, as illustrated in FIG. 5, sensing noise is caused in a bank by an active operation of another bank when a word line WL of the bank is disabled by the precharge command and the cell NMOS transistor N1 turns off. The data damaged by the sensing noise are stored on the storage node SN. Accordingly, data retention time decrease and each cell cannot perform a refresh operation appropriately.

SUMMARY OF THE INVENTION

It is, therefore, an object of the present invention to provide a semiconductor memory device prohibiting malfunction such as data loss due to a sensing noise and a driving method thereof.

In accordance with an aspect of the present invention, there is provided a semiconductor memory device with a plurality of banks, including a bit line sense amplifier for sensing and amplifying data applied on a bit line pair, and a supply line driver for supplying pull-up and pull-down supply lines of the bit line sense amplifier with a pull-up voltage and a pull-down voltages, wherein the pull-down voltage is adjusted according to an operation period.

In accordance with another aspect of the present invention, there is provided a semiconductor memory device with a plurality of banks, including, a bit line sense amplifier for sensing and amplifying the data applied on the bit line pair, a pull-up driver for driving the pull-up supply line of the bit line sense amplifier with the pull-up voltage in response to a pull-up driving signal, a first pull-down driver for driving the pull-down supply line of the bit line sense amplifier with the first pull-down voltage in response to a first pull-down driving signal activated in the first driving period, a second pull-down driver for driving the pull-down supply line with the second pull-down voltage different from the first pull-down voltage in response to a second pull-down driving signal activated in the second driving period, and a driving controller for generating the pull-up driving signal and the first and the second pull-down driving signals in response to active and precharge command signals.

In accordance with further aspect of the present invention, there is provided a driving method of semiconductor memory device with a plurality of banks, including driving the pull-up supply line of the bit line sense amplifier with the pull-up voltage and the pull-down supply line of the bit line sense amplifier with the first pull-down voltage, and driving the pull-up supply line of the bit line sense amplifier with the pull-up voltage and pull-down supply line of the bit line sense amplifier with the second pull-down voltage different from the first pull-down voltage.

In the present invention, first and second separate pull-down supply voltages are used as a pull-down supply voltage of a bit line sense amplifier. By using the first and the second pull-down supply voltages in different operation periods, data are secured from noises generated by another bank operation. The operation periods are separated into an initial sensing period and subsequent stable period. Large currents are consumed and larger noises are generated in initial sensing period. Also the operation periods are separated into pre and post precharge periods.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE INVENTION

Hereinafter, a semiconductor memory device having a shared bit line sense amplifier scheme and a driving method thereof in accordance with exemplary embodiments of the present invention will be described in detail with reference to the accompanying drawings.

Figure 6:
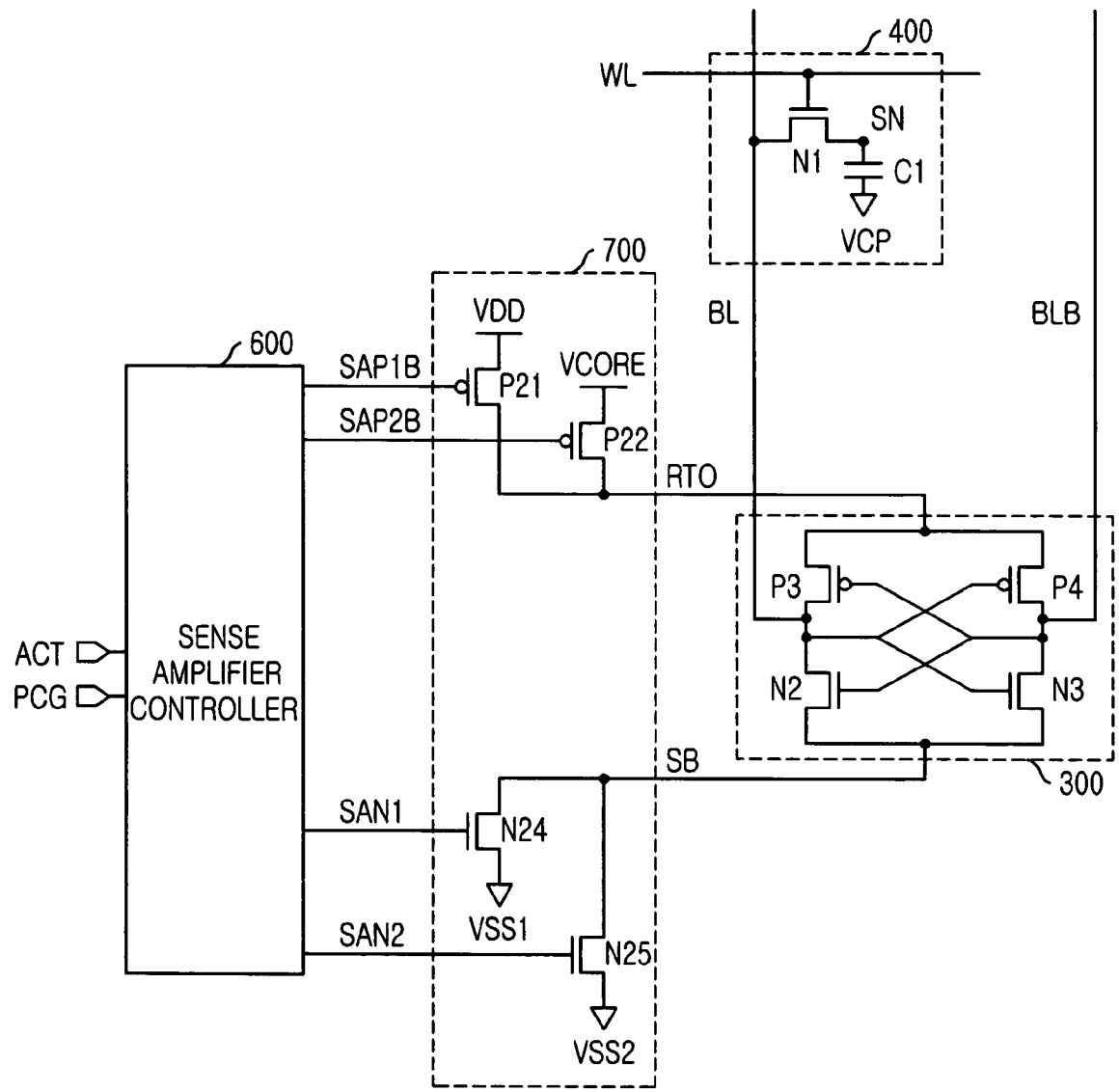
FIG. 6 is a block diagram of a DRAM core in accordance with the present invention.

FIG. 6 is a block diagram of a DRAM core in accordance with the present invention;

Referring to FIG. 6, the DRAM core comprises a memory cell 400, a bit line sense amplifier 300, a supply line driver 700 and a sense amplifier controller 600.

The memory cell 400 and the bit line sense amplifier 300 are similar to corresponding elements of the conventional scheme described above. The supply line driver 700 and the sense amplifier controller 600 are designed differently.

The supply line driver 700 includes an over-driving PMOS transistor P21, a normal-driving PMOS transistor P22, a first driving NMOS transistor N24 and a second driving NMOS transistor N25. The over-driving PMOS transistor P21 supplies a RTO line with an external supply voltage VDD in response to a first RTO line driving signal SAP1B. The normal-driving PMOS transistor P22 supplies the RTO line with a core voltage VCORE in response to a second RTO line driving signal SAP2B. The first driving NMOS transistor N24 drives a SB line with a first ground voltage VSS1 in response to a first SB line driving signal SAN1. The second driving NMOS transistor N25 drives the SB line with a second ground voltage VSS2 in response to a second SB line driving signal SAN2.

The first ground voltage VSS1 and the second ground voltage VSS2 are mutually distinguished and independent voltages, and the first SB line driving signal SAN1 and the second SB line driving signal SAN2 are activated in respectively different periods.

When an active command is input in precharge condition, an active command signal ACT is activated as a logic high level. Accordingly, a word line WL is enabled and a cell NMOS transistor N1 turns on. Data charge stored in a cell capacitor C1 is transferred to a bit line. When the word line is enabled, one of the bit line pair BL and BLB and a storage node SN is coupled to transfer datacharge and, thereby, develop a fine voltage difference between the bit line BL and bit line bar BLB.

When the bit line sense amplifier 300 is enabled thereafter, the RTO line driving signal SAP1B is activated as a logic low level. And the first SB line driving signal SAN1 is activated as a logic high level. Accordingly, an over-driving PMOS transistor P21 supplies the RTO line with the eternal supply voltage VDD. The first driving NMOS transistor N24 drives the SB line with the first ground voltage VSS1.

The over-driving operation is completed, and then the over-driving PMOS transistor P21 turns off. As the second RTO line driving signal SAP2B is activated as a logic low level, the normal-driving PMOS transistor P22 supplies the RTO line with the core voltage VCORE.

The SB line is driven with the first ground voltage VSS1 by the first SB line driving signal SAN1 activated as a logic high level in an initial operation for sensing and amplifying data. After a certain time when amplified data is stable, the first SB line driving signal SAN 1 is non-activated as a logic low level. The second SB line driving signal SAN2 is activated as a logic high level and the SB line is driven with the second ground voltage VSS2

Because the second RTO line driving signal SAP2B and the second SB line driving signal SAN2 are activated when amplified data are stable, the times for activation may be similar, although the times for activation of two signals have no relation.

Figure 7:
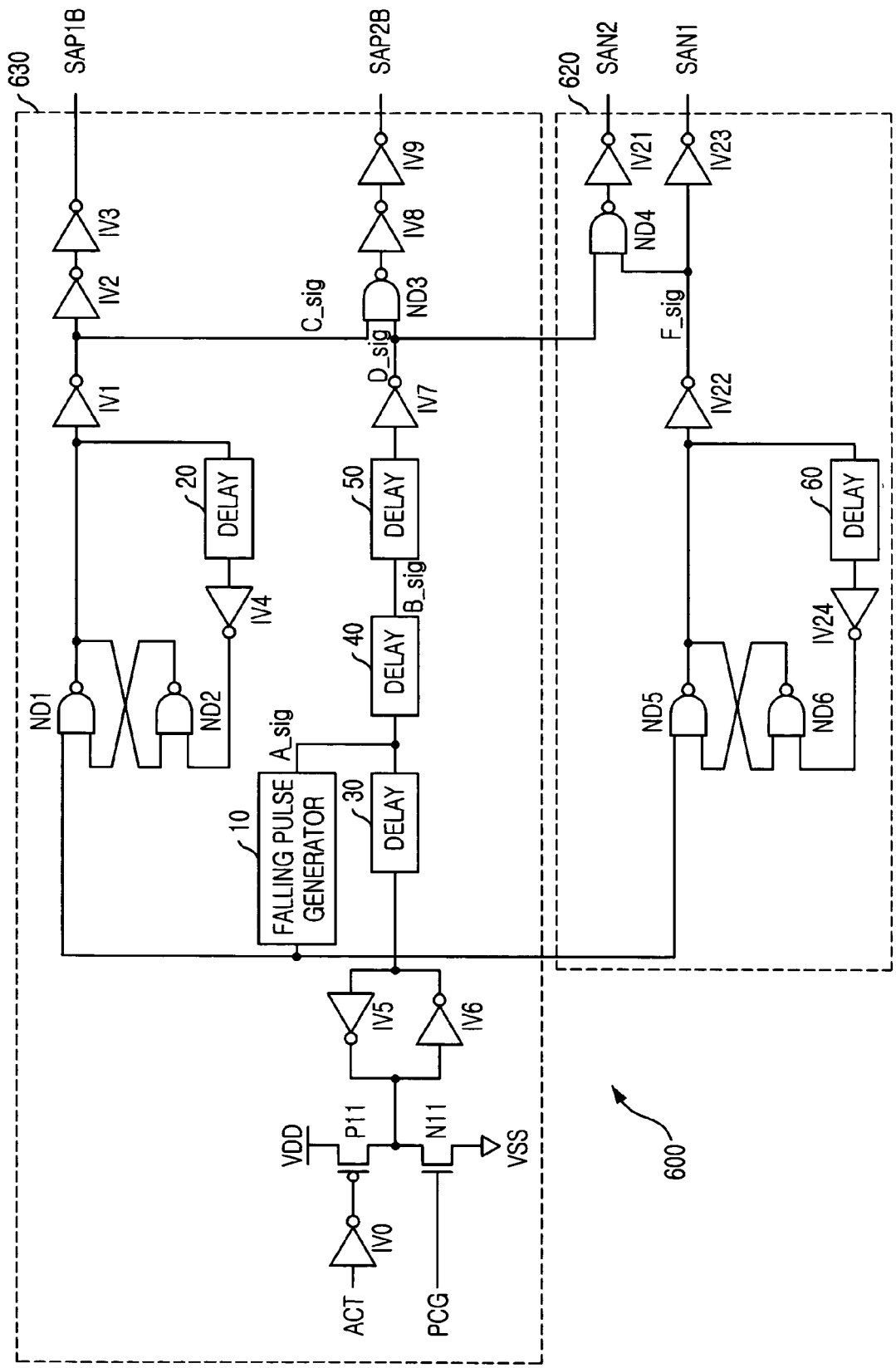
FIG. 7 is a schematic circuit diagram of a sense amplifier controller shown in FIG. 6 in accordance with a first embodiment.

FIG. 7 is a schematic circuit diagram of the sense amplifier controller 600 shown in FIG. 6 in accordance with a first embodiment.

Referring to FIG. 7, the sense amplifier controller 600 is provided with a RTO line driving signal generator 630 and a SB line driving signal generator 620. The RTO line driving signal generator 630 generates the first and the second RTO line driving signals SAP1B and SAP2B in response to the active command signal ACT and the precharge command signal PCG. The SB line driving signal generator 620 generates the first and the second SB line driving signals SAN1 and SAN2 in response to an output of The RTO line driving signal generator 630.

Figure 1:
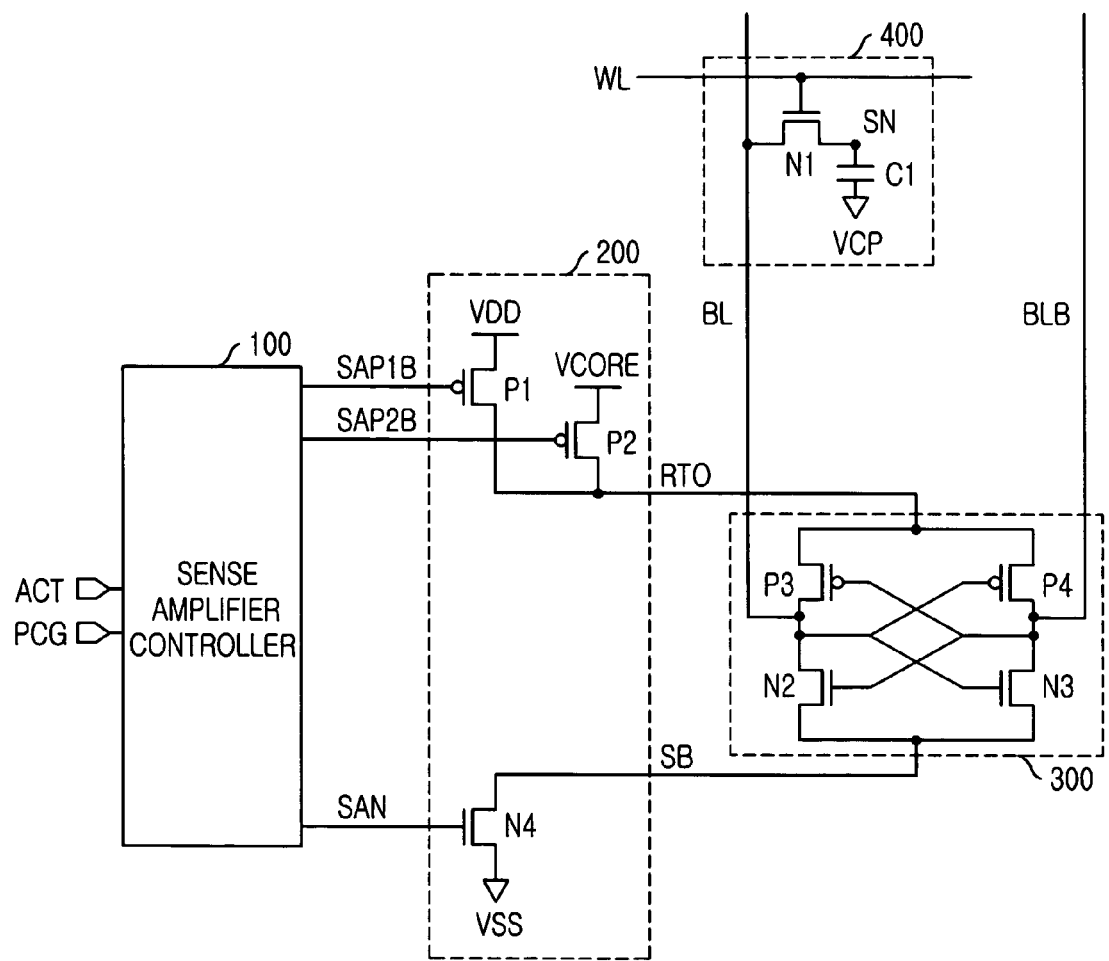
FIG. 1 is a block diagram of a conventional DRAM core performing an over-driving operation.
Figure 2:
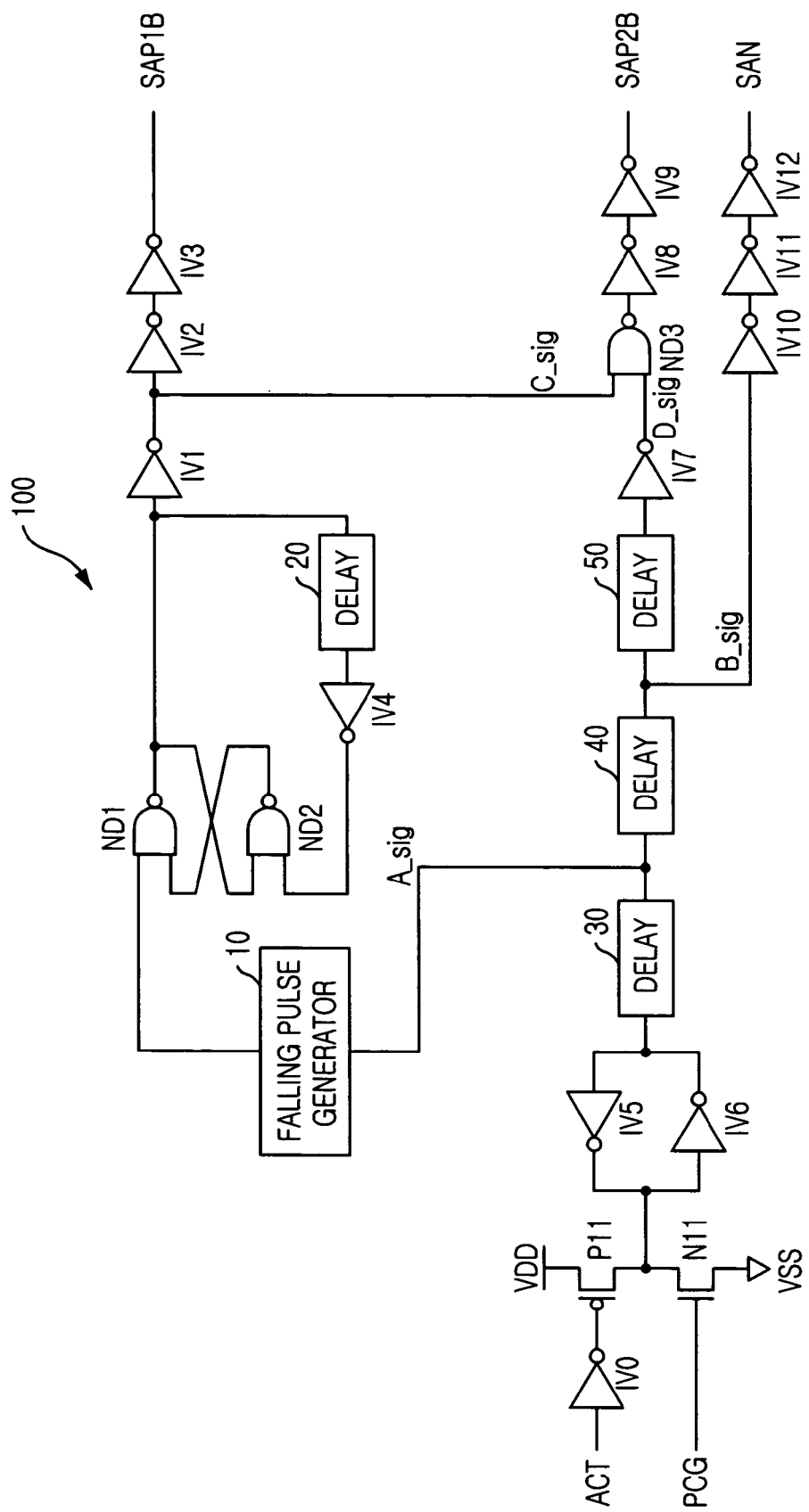
FIG. 2 is a schematic circuit diagram of a sense amplifier controller shown in FIG. 1.

The RTO line driving signal generator 630 has the same architecture generating the first and the second RTO line driving signals SAP1B and SAP2B as the conventional generator (Referring to FIG. 2).

The SB line driving signal generator 620 is provided with a cross-coupled NAND latch consisting of NAND gates ND5 and ND6, three inverters IV21 to IV23 and a NAND gate ND4. The cross-coupled NAND latch receives an output of a falling pulse generator 10 in the RTO line driving signal generator 630 as a set signal and its own output inverted/delayed by a fifth delay 60 having a fifth delay time tDelay5 and a fourteenth inverter IV24 as a reset signal. The twelfth inverter IV22 receives an output of the cross-coupled NAND latch and the thirteenth inverter IV23, receiving a signal F_sig, an output of the twelfth inverter IV22, outputs the first SB line driving signal SAN1. The fourth NAND gate ND4 receives the signal F_sig and the signal D_sig, the output of the eighth inverter IV7 in the RTO line driving signal generator 630. The eleventh inverter IV21 inverts an output of the fourth NAND gate ND4 and outputs the second SB line driving signal SAN2.

Figure 3:
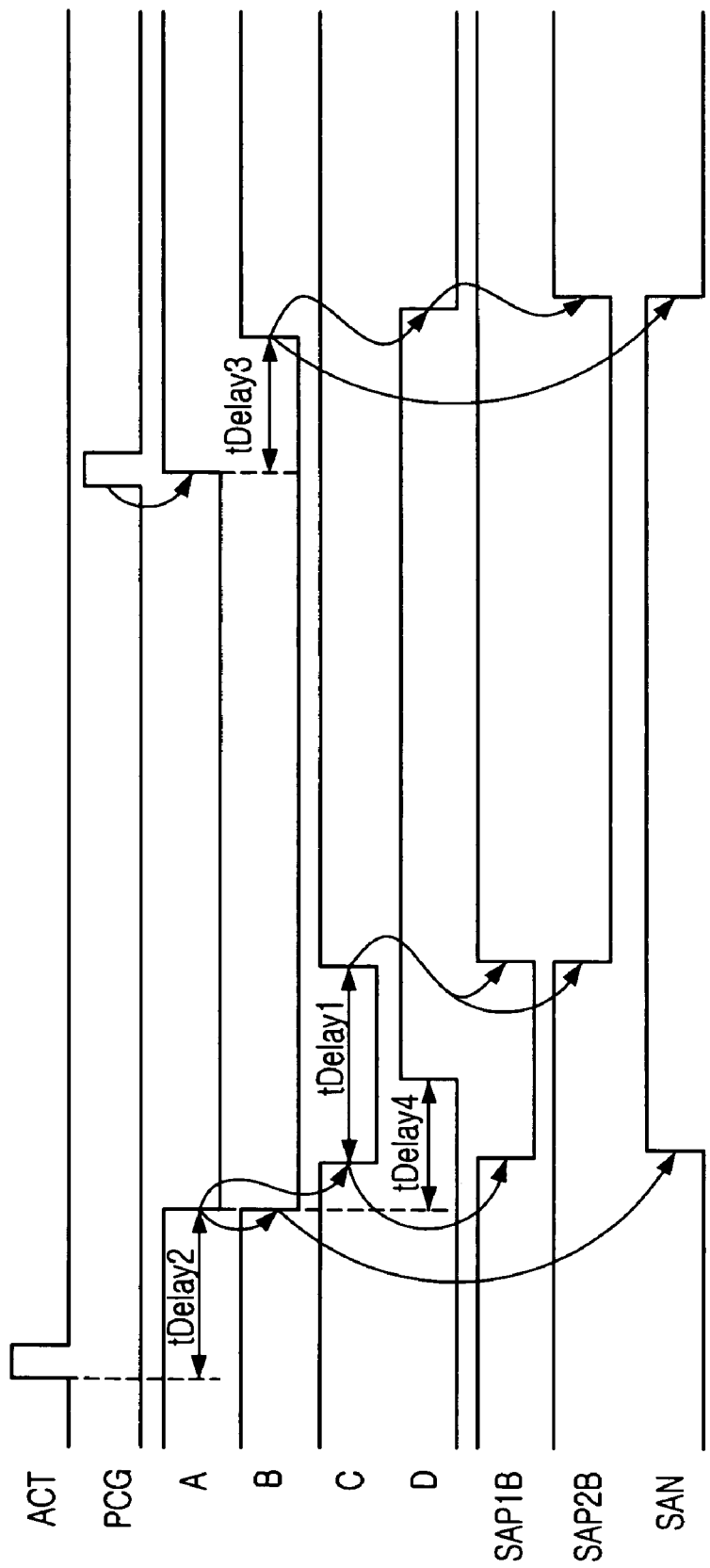
FIG. 3 is a timing diagram for illustrating an operation of the sense amplifier controller shown in FIG. 2.
Figure 4:
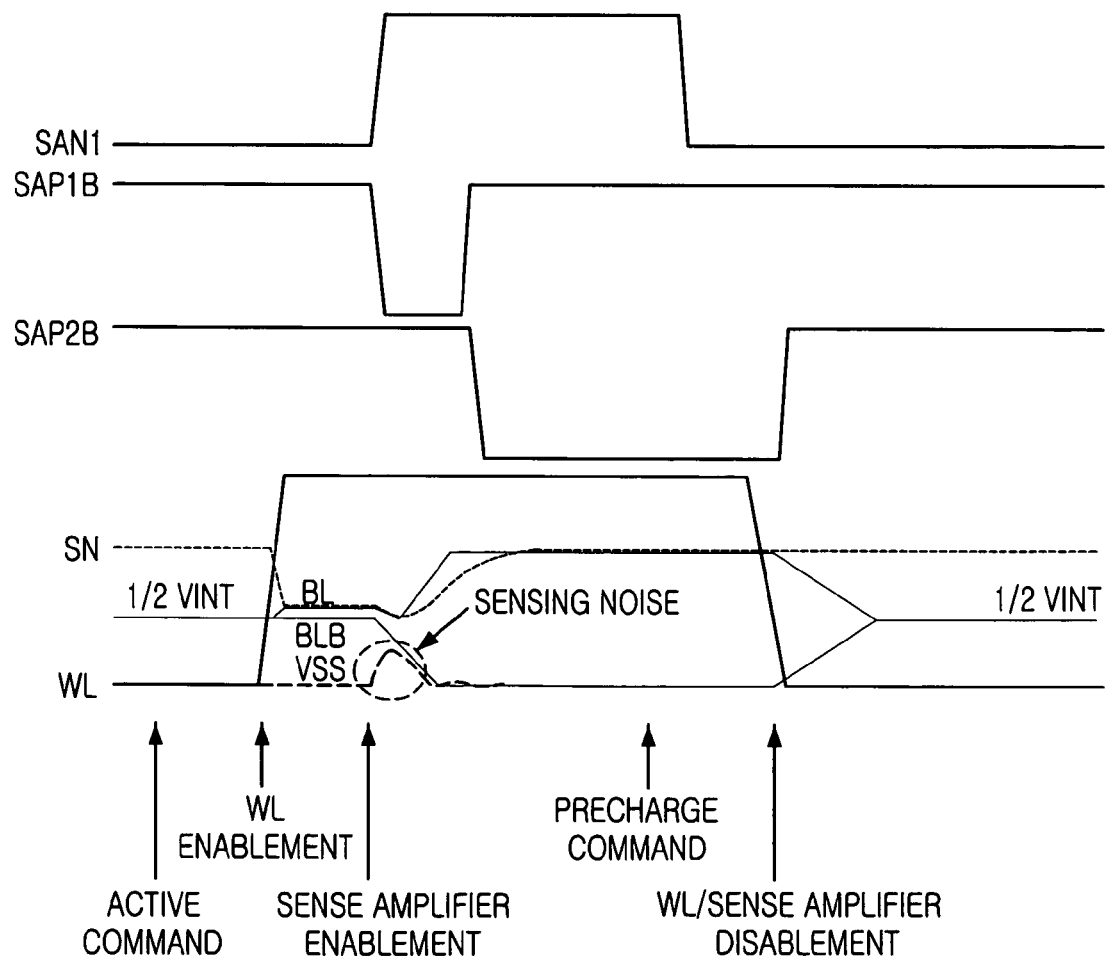
FIG. 4 is a timing diagram for illustrating an operation of the conventional DRAM core shown in FIG. 1.
Figure 5:
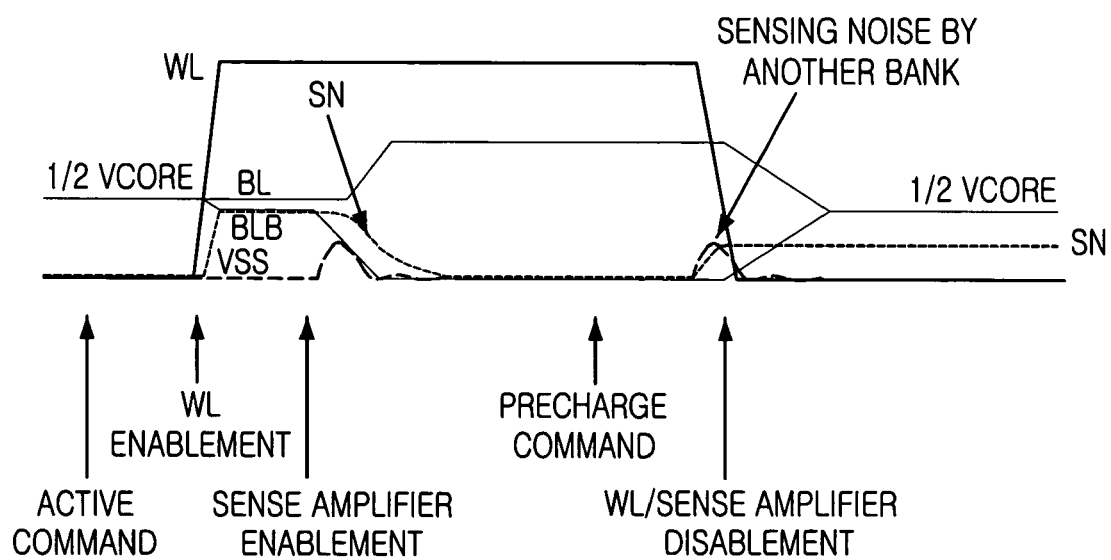
FIG. 5 is a waveform diagram for illustrating sensing noise occurring in the conventional DDR core.
Figure 8:
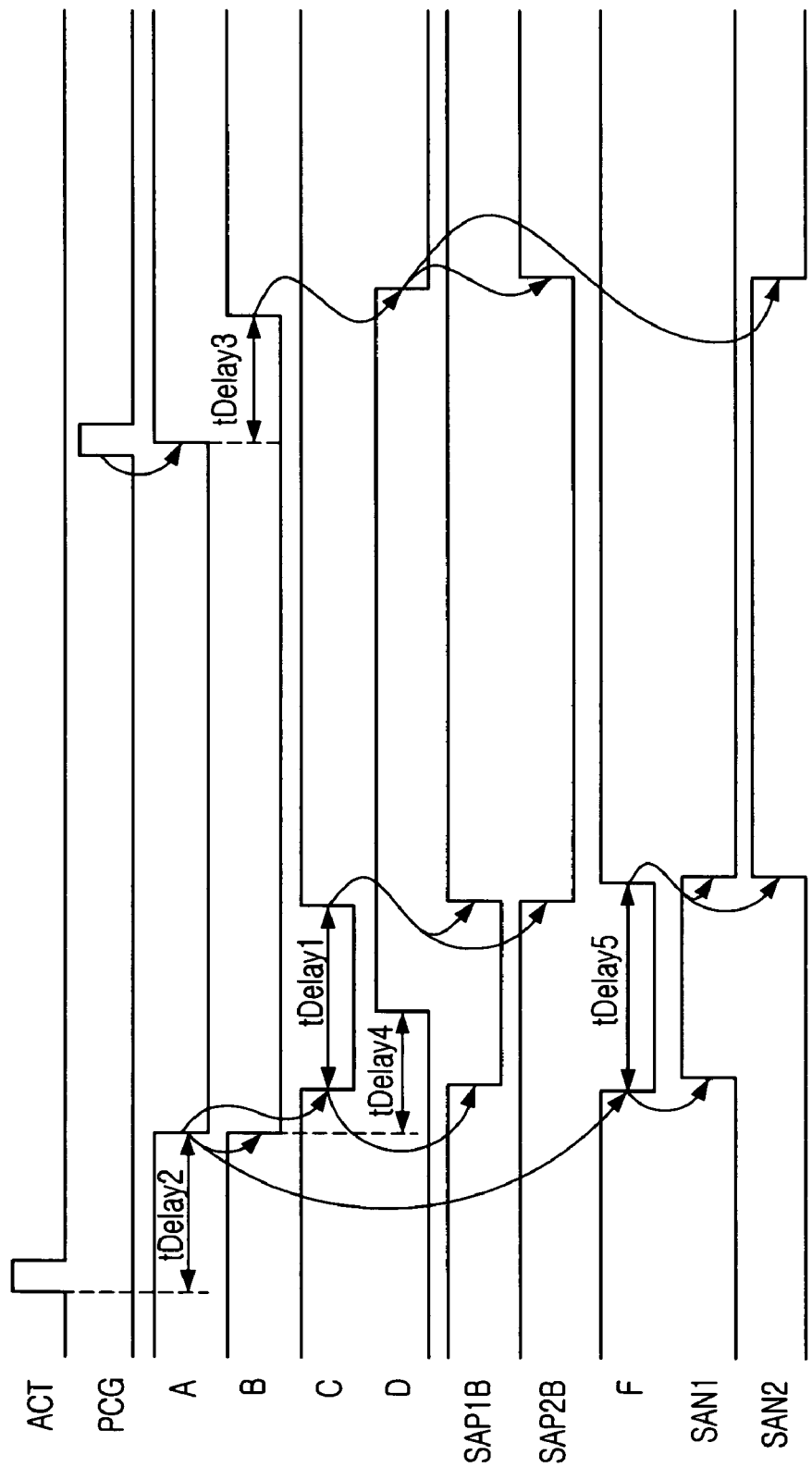
FIG. 8 is a timing diagram for illustrating an operation of the sense amplifier controller shown in FIG. 7.

FIG. 8 is a timing diagram for illustrating an operation of the sense amplifier controller 600 shown in FIG. 7;

The wave pattern of signals A_sig to D_sig and the first and the second RTO line driving signals SAP1B and SAP2B are the same as described with respect to FIG. 3. The signal F_sig has a similar wave pattern as the signal C_sig. However, the first delay time tDelay1 and the fifth delay time tDelay5 are different. According to pulse widths of the first RTO line driving signal SAP1B and the first SB line driving signal SAN1, the delay times are settled appropriately.

Figure 9:
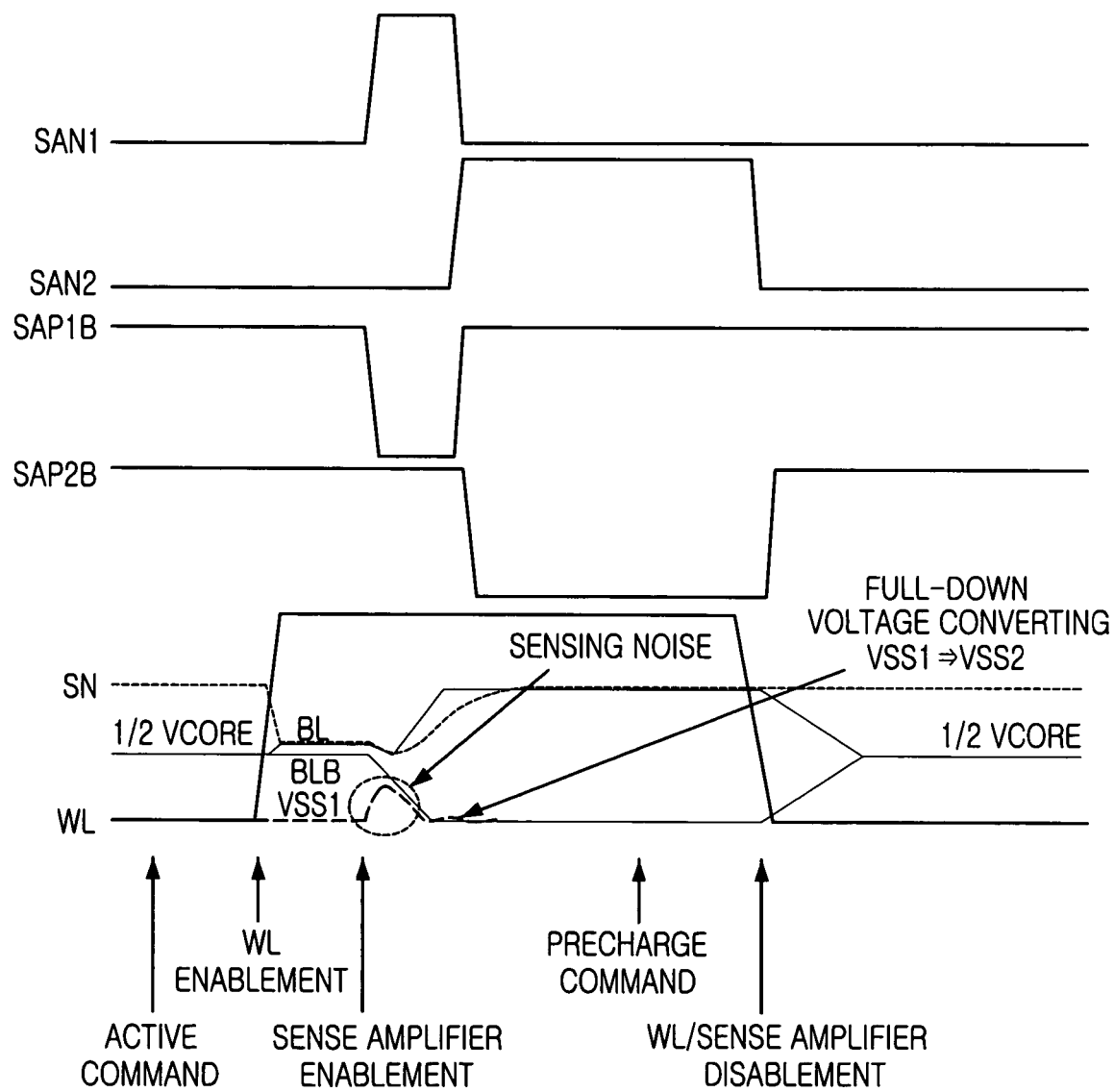
FIG. 9 is a timing diagram for illustrating an operation of the DRAM core shown in FIG. 6 in accordance with the first embodiment.

FIG. 9 is a timing diagram for illustrating an operation of the DRAM core shown in FIG. 6 in accordance with the first embodiment.

Referring to FIG. 9, amplifying operation such as the over-driving operation is performed by the first RTO line driving signal SAP1B and the first SB line driving signal SAN1 in initial sensing and amplifying period after bit line sense amplifier is enabled. When the first and the second SB line driving signals SAN1 and SAN2 are transited, pull-down voltage of the bit line sense amplifier is converted from the first ground voltage VSS1 into the second ground voltage VSS2.

The first ground voltage VSS1 is raised by noises from initial amplifying, and becomes stable soon thereafter. The core voltage VCORE is also unstable when the first and the second RTO line driving signal SAP1B and SAP2B are transited, but becomes stable soon thereafter.

Figure 10:
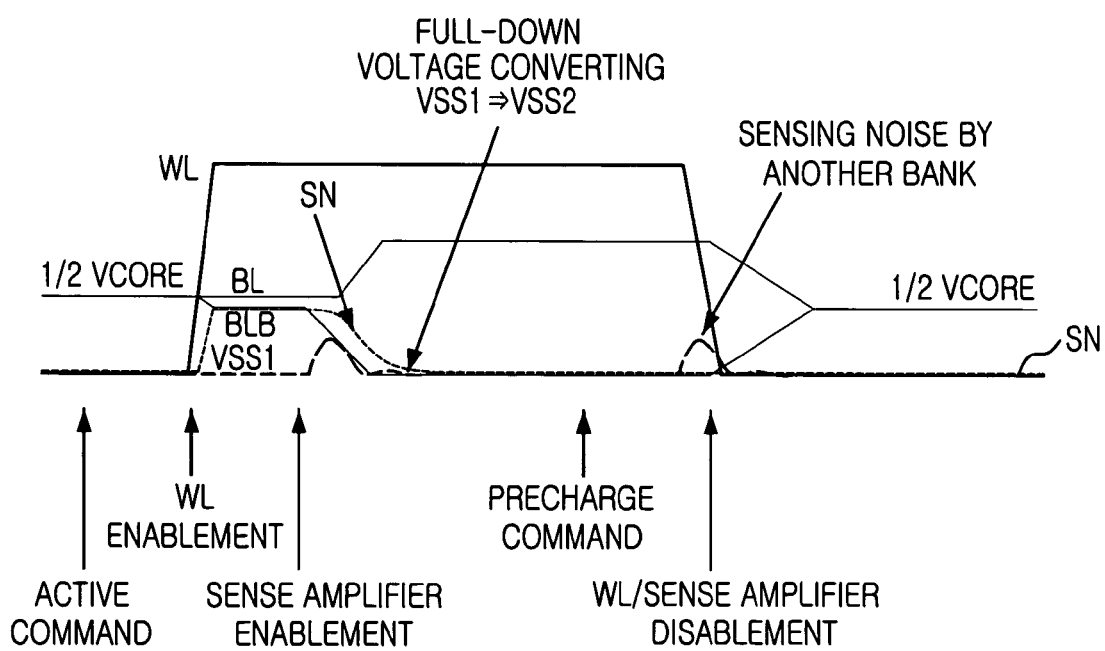
FIG. 10 is a waveform diagram for illustrating prevention of sensing noise in accordance with the first embodiment.

FIG. 10 is a waveform for illustrating prevention of sensing noise in accordance with the first embodiment.

As shown in FIG. 10, a word line WL of the corresponding bank is disabled at the beginning of the precharge operation. At the same time, active operation of another bank begins and sensing noises are generated by another bank. In the present invention, no influence of the sensing noises is caused, because a SB line of a bit line sense amplifier is driven with the first ground voltage VSS1 in the active operation while a SB line of a bit line sense amplifier is driven with the second ground voltage VSS2 in a subsequent operation.

Figure 11:
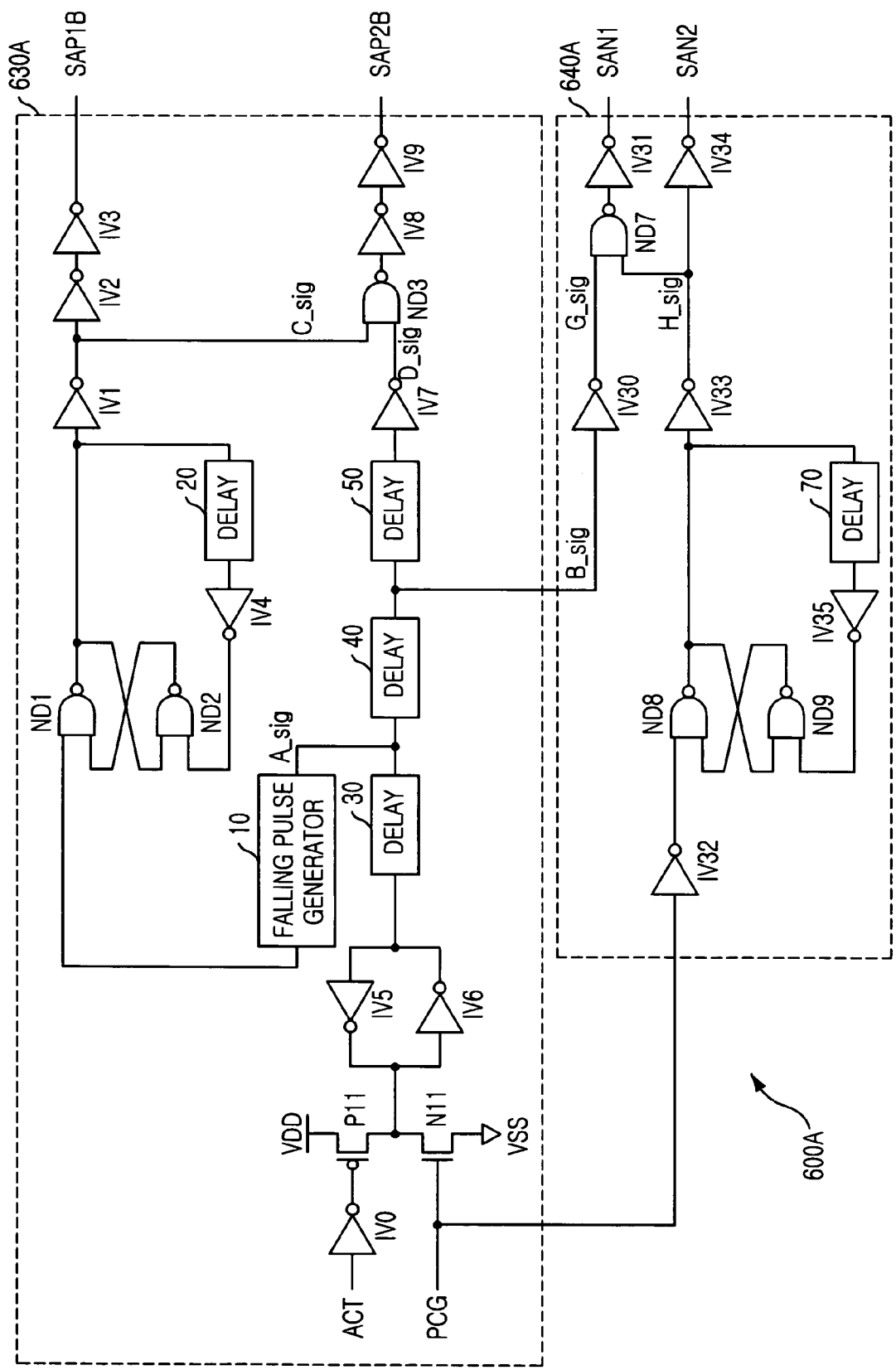
FIG. 11 is a schematic circuit diagram of the sense amplifier controller shown in FIG. 6 in accordance with a second embodiment.

FIG. 11 is a schematic circuit diagram of the sense amplifier controller shown in FIG. 6 in accordance with a second embodiment.

The sense amplifier controller 600A also is provided with a RTO line driving signal generator 630A and a SB line driving signal generator 640A. The RTO line driving signal generator 630A generates the first and the second RTO line driving signals SAP1B and SAP2B in response to the active command signal ACT and the precharge command signal PCG. The SB line driving signal generator 640A generates the first and the second SB line driving signals SAN1 and SAN2 in response to an output of The RTO line driving signal generator 630A.

The RTO line driving signal generator 630A has the same architecture generating the first and the second RTO line driving signals SAP1B and SAP2B as the conventional scheme (Referring to FIG. 2) and the first embodiment (Referring to FIG. 7).

The SB line driving signal generator 640A is provided with a cross-coupled NAND latch consisting of NAND gates ND8 and ND9, six inverters IV30 to IV35 and a fourth NAND gate ND7. The thirteenth inverter IV32 receives the precharge command signal PCG. The cross-coupled NAND latch receives an output of the thirteenth inverter IV32 as a set signal and its own output inverted/delayed by a fifth delay 70 having a delay time: tDelay6) and a sixteenth inverter IV35 as a reset signal. The fourteenth inverter IV33 receives an output of the cross-coupled NAND latch and the fifth inverter IV34 receiving a signal H_sig, an output of the fourteenth inverter IV33, outputs the second SB line driving signal SAN2. The eleventh inverter IV30 receives the signal B_sig. The fourth NAND gate ND7 performs a logic NAND operation to a signal G_sig, an output of the eleventh inverter IV30, and the signal H. The twelfth inverter IV31, receiving an output of the fourth. NAND gate ND7, outputs the first SB line driving signal SAN1.

The precharge command signal PCG is used to generate the first and the second SB line driving signals SAN1 and SAN2 in the second logic embodiment. The first and the second SB line driving signals SAN1 and SAN2 are transited in response to the precharge command signal PCG.

Figure 12:
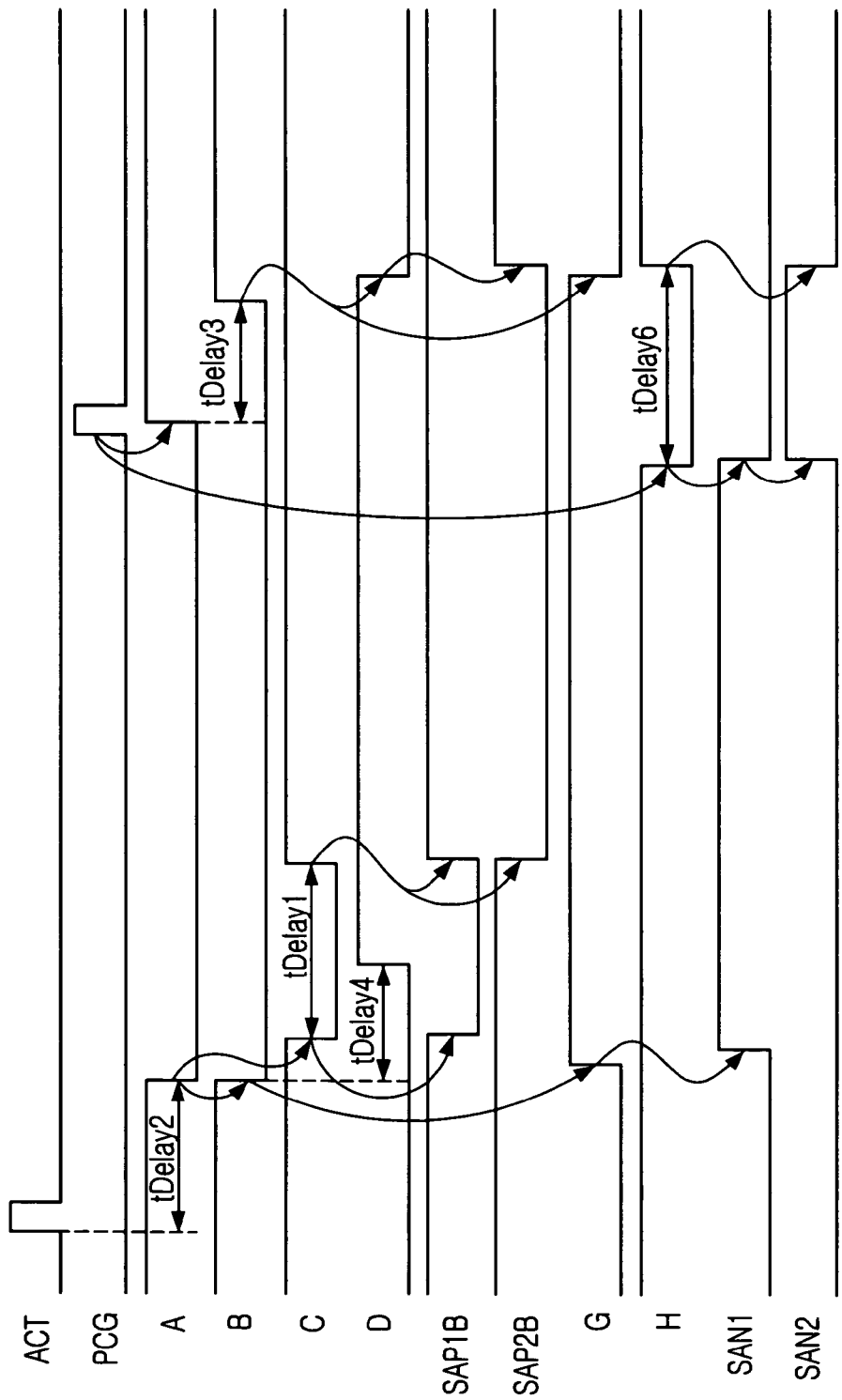
FIG. 12 is a timing diagram for illustrating an operation of the sense amplifier controller shown in FIG. 11.

FIG. 12 is a timing diagram for illustration an operation of the sense amplifier controller 600A shown in FIG. 11;

The wave pattern of signals A_sig to D_sig and the first and the second RTO line driving signals SAP1B and SAP2B correspond with the explanation of FIG. 3. Similar to the first logic embodiment, the first SB line driving signal SAN1 is activated to a logic high level by using the signal B_sig.

However, an inactivation time of the first SB line driving signal SAN1 and an activation time of the second SB line driving signal SAN2 are determined by not the delay time, but the precharge command signal PCG in the second embodiment of the present invention. The fifth delay 70 in the SB line driving signal generator 640A determines a pulse width of the second SB line driving signal SAN2. Accordingly, the delay time is determined to meet inactivation time of the second RTO line driving signal SAP2B appropriately.

Figure 13:
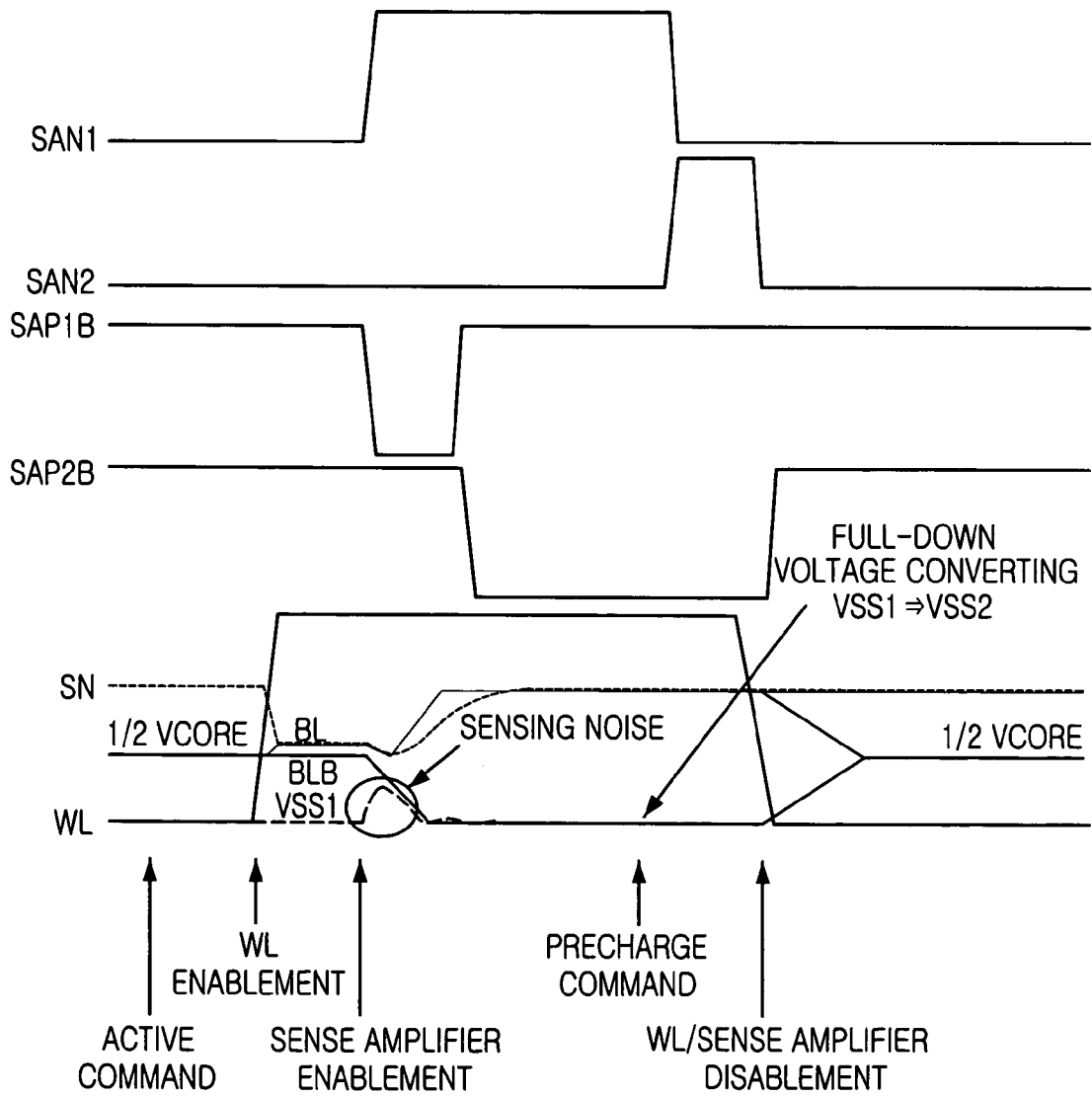
FIG. 13 is a timing diagram for illustrating an operation of the DRAM core shown in FIG. 6 in accordance with the second embodiment.

FIG. 13 is a timing diagram for illustrating operation of the DRAM core shown in FIG. 6 in accordance with the second embodiment. And FIG. 14 is a waveform for illustrating prevention of sensing noise in accordance with the second embodiment.

Figure 14:
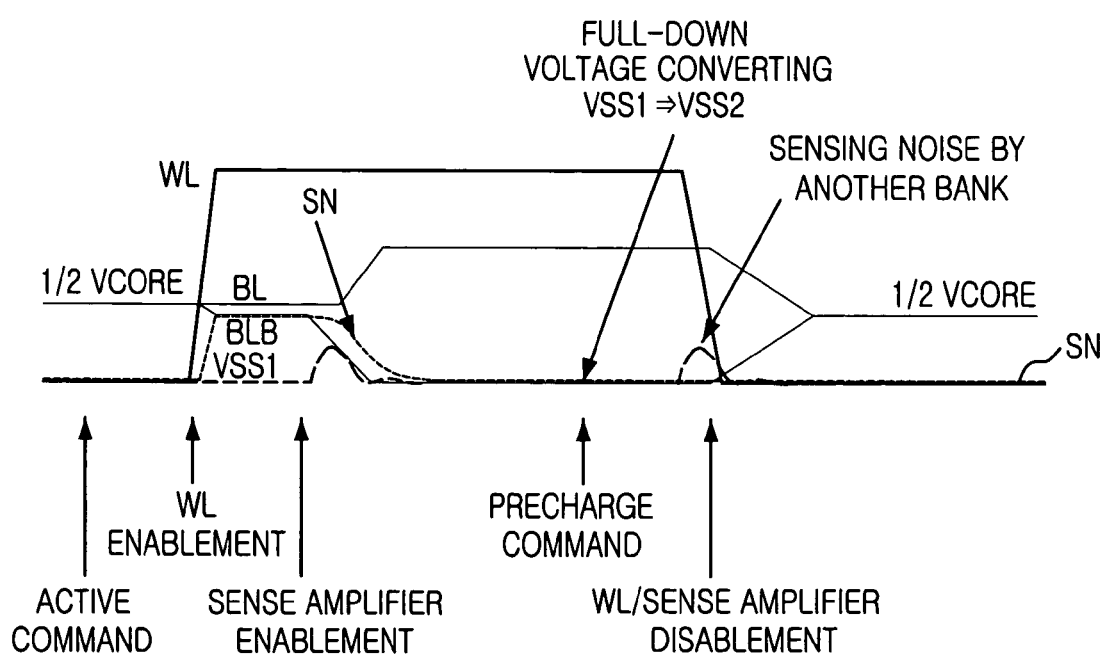
FIG. 14 is a waveform diagram for illustrating prevention of sensing noise in accordance with the second embodiment.

Referring to FIGS. 13 and 14, the over-driving operation is performed in response to the first SB and the first RTO line driving signals SAN1 and SAP1B at the initial sensing and amplifying period after the bit line sense amplifier is enabled. Thereafter, the normal-driving operation is performed in response to the first SB and the second RTO line driving signals SAN1 and SAP2B. The bit line sense amplifier is driven in the response to the second SB and the second RTO line driving signals SAN2 and SAP2B after the precharge command signal is input.

The pull-down power of the bit line sense amplifier is converted from the first ground voltage VSS1 to the second ground voltage VSS2 according to the precharge command signal. When a word line WL of the corresponding bank is disabled at the beginning of the precharge operation, another bank generates the sensing noises. While a SB line of a bit line sense amplifier in the corresponding bank is driven with the second ground voltage VSS2, a SB line of a bit line sense amplifier in another bank is driven with the first ground voltage VSS1. The corresponding data access can be performed regardless of the sensing noises occurring in other banks.

The present invention is applicable to not only above embodiment but also various methods.

For example, besides the over driving operation driving a RTO line with a normal driver and an over driver, another embodiment for driving a RTO line with a normal driver and driving a normal driver supply line with an over driver is possible in the present invention. Using supply voltage VDD as over driving voltage and using core voltage VCORE as normal driving voltage are additional alternatives.

In addition, besides first and second ground voltages, other base voltages could be used for pull down voltage of a SB line.

The present invention is efficient to prevent sensing noises of one bank from affecting another bank by dividing an operation period of a bit line sense amplifier into plural sections and supplying different voltage in each section. Particularly, the present invention stabilizes supply voltage in precharge operation and prevents data loss in a memory cell. Accordingly, data retention time increases and refresh operation is improved.

The present application contains subject matter related to Korean patent applications Nos. 10-2005-0091685 and 10-2006-0050041, filed in the Korean Patent Office on Sep. 29, 2005 and Jun. 2, 2006 respectively, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
   a bit line sense amplifier for sensing and amplifying data supplied on a bit line;
   a supply line driver for supplying pull-up and pull-down supply lines coupled to the bit line sense amplifier with a pull-up voltage and a pull-down voltage, wherein the pull-down voltage is adjusted according to an operation period,
   wherein the pull-down voltage is adjusted to a first pull-down voltage in a first driving period and is adjusted to a second pull-down voltage in a second driving period, and wherein the first driving period is an initial sensing and amplifying period of the bit line sense amplifier and the second driving period is a stable period after the initial sensing and amplifying period,
   wherein the first driving period extends from an enable time of the bit line sense amplifier to an input time of a precharge command and the second driving period extends from the input time of the precharge command to a disable time of the bit line sense amplifier.

2. The semiconductor memory device of claim 1, wherein the pull-up voltage is over driving voltage or normal driving voltage.

3. The semiconductor memory device of claim 2, wherein the over driving voltage is an external supply voltage and the normal driving voltage is core voltage.

4. A semiconductor memory device, comprising:
   a bit line sense amplifier for sensing and amplifying the data supplied on a bit line pair;
   a pull-up driver for supplying a pull-up supply line of the bit line sense amplifier with a pull-up voltage in response to a pull-up driving signal;
   a first pull-down driver for supplying a pull-down supply line of the bit line sense amplifier with a first pull-down voltage in response to a first pull-down driving signal activated in a first driving period;
   a second pull-down driver for supplying the pull-down supply line with s second pull-down voltage different from the first pull-down voltage in response to a second pull-down driving signal activated in a second driving period; and
   a driving controller for generating the pull-up driving signal and the first and the second pull-down driving signals in response to active and precharge command signals.

5. The semiconductor memory device of claim 4, wherein the first driving period is an initial sensing and amplifying period of the bit line sense amplifier and the second driving period is a stable period after the initial sensing and amplifying period.

6. The semiconductor memory device of claim 4, wherein the first driving period extends from an enable time of the bit line sense amplifier to an input time of the precharge command and the second driving period extends from the input time of the precharge command to a disable time of the bit line sense amplifier.

7. The semiconductor memory device of claim 4, wherein the pull-up driver comprises:
   a first pull-up driver for supplying the pull-up supply line of the bit line sense amplifier with a first pull-up voltage in response to a first pull-up driving signal in an over driving period; and
   a second pull-up driver for supplying the pull-up supply line of the bit line sense amplifier with s second pull-up voltage in response to a second pull-up driving signal in a normal driving period.

8. The semiconductor memory device of claim 4, wherein the first pull-down driver comprises a first NMOS transistor having:
   a gate for receiving the first pull-down driving signal;
   a source for being connected to the first pull-down voltage; and
   a drain for being connected to the pull-down supply line.

9. The semiconductor memory device of claim 8, wherein the second pull-down driver comprises a second NMOS transistor having:
   a gate for receiving the second pull-down driving signal;
   a source for being connected to the second pull-down voltage; and
   a drain for being connected to the pull-down supply line.

10. The semiconductor memory device of claim 8, wherein the first pull-down voltage is a first ground voltage and the second pull-down voltage is a second ground voltage.

11. The semiconductor memory device of claim 4, wherein the driving controller includes:
    a first inverter for receiving an active command signal;
    a pull-up PMOS transistor controlled by output of the first inverter;
    a pull-down NMOS transistor controlled by a precharge command signal;
    an inverter latch connected with a coupled output node of the pull-up PMOS transistor and the pull-down NMOS transistor;
    a first delay for delaying a falling edge of output of the inverter latch;
    a falling pulse generator for generating a pulse in response to a falling edge of output of the first delay;
    a first cross-coupled NAND latch coupled to the output of the falling pulse generator as a set signal and coupled through a second delay and a second inverter to its output as a reset signal;
    a third inverter coupled to the output of the first cross-coupled NAND latch;
    a fourth inverter coupled to the output of the third inverter;
    a fifth inverter coupled to the output of the fourth inverter and outputting the first pull-up driving signal;
    a third delay for delaying a rising edge of the output of the first delay;
    a fourth delay for delaying a falling edge of an output of the third delay;
    a six inerter coupled to the output of the fourth delay;
    a first NAND gate coupled to the output of the sixth inverter and the third inverter;
    a seventh inverter coupled to the output of the first NAND gate;
    an eighth inverter coupled to the output of the seventh inverter and outputting the second pull-up driving signal;
    a second cross-coupled NAND latch coupled to the output of the falling pulse generator as a set signal and coupled through a fifth delay and a ninth inverter to its output as a reset signal;
    a tenth inverter coupled to the output of the second cross-coupled NAND latch;
    an eleventh inverter coupled to the output of the tenth inverter outputting the first pull-down driving signal;
    a second NAND gate coupled to the output of the sixth inverter and the eleventh inverter;

a twelve inverter coupled to the output of the second NAND gate and outputting the second pull-down driving signal.

12. The semiconductor memory device of claim 4, wherein the driving controller includes:
a first inverter for receiving an active command signal;
a pull-up PMOS transistor coupled to an output of the first inverter;
a pull-down NMOS transistor coupled to a precharge command signal;
an inverter latch connected with a coupled output node of the pull-up PMOS transistor and the pull-down NMOS transistor;
a first delay for delaying a falling edge of output of the inverter latch;
a falling pulse generator for generating a pulse in response to a falling edge of output of the first delay;
a first cross-coupled NAND latch coupled to an output of the falling pulse generator as a set signal and coupled through a second delay and a second inverter to its output as a reset signal;
a third inverter coupled to an output of the first cross-coupled NAND latch;
a fourth inverter coupled to an output of the third inverter;
a fifth inverter coupled to an output of the fourth inverter and outputting the first pull-up driving signal;
a third delay for delaying a rising edge of the output of the first delay;
a fourth delay for delaying a falling edge of output of the third delay;
a six inverter coupled to the output of the fourth delay;
a first NAND gate coupled to the output of the sixth inverter and the third inverter;
a seventh inverter coupled to the output of the first NAND gate;
an eighth inverter coupled to the output of the seventh inverter and outputting the second pull-up driving signal;
a ninth inverter coupled to the precharge command signal;
a second cross-coupled NAND latch coupled to the output of the ninth inverter as a set signal and coupled through a fifth delay and a tenth inverter to its output as a reset signal;
an eleventh inverter coupled to the output of the second cross-coupled NAND latch;
a twelfth inverter coupled to the output of the eleventh inverter outputting the second pull-down driving signal;
a thirteenth inverter coupled to the output of the third delay;
a second NAND gate coupled to the output of the thirteenth inverter and the eleventh inverter;
a fourteenth inverter coupled to the output of the second NAND gate and outputting the first pull-down driving signal.

13. The semiconductor memory device of claim 7, wherein the pull-up driver comprises:
a first PMOS transistor having a gate receiving the first driving signal, a source supplied with external voltage and a drain connected with the pull-up supply line; and
a second PMOS transistor having a gate receiving the second driving signal, a source supplied with core voltage and a drain connected with the pull-up supply line.

14. A driving method of a semiconductor memory device with plural banks, comprising:
driving pull-up and pull-down supply lines of a bit line sense amplifier with pull-up and first pull-down voltages; and
driving the pull-up and the pull-down supply lines of the bit line sense amplifier with the pull-up and second pull-down voltages different from the first pull-down voltage,
wherein the first pull-down voltages is used in a period extending from an enable time of the bit line sense amplifier to an input time of a precharge command and the second pull-down voltages is used in a period extending from the input time of the precharge command to a disable time of the bit line sense amplifier.

15. The driving method of a semiconductor memory device of claim 14, wherein the first pull-down voltages is used in an initial sensing and amplifying period of the bit line sense amplifier and the second pull-down voltages is used in a stable period after the initial sensing and amplifying period.

16. The driving method of a semiconductor memory device of claim 14, wherein the pull-up voltage is over driving voltage or normal driving voltage.

17. A semiconductor memory device, comprising:
a bit line sense amplifier for sensing and amplifying data supplied on a bit line; and
a supply line driver for supplying pull-up and pull-down supply lines coupled to the bit line sense amplifier with a pull-up voltage and a pull-down voltage,
wherein the pull-down voltage is adjusted to a first pull-down voltage in a first driving period and is adjusted to a second pull-down voltage in a second driving period,
wherein the first driving period extends from an enable time of the bit line sense amplifier to an input time of a precharge command and the second driving period extends from the input time of the precharge command to a disable time of the bit line sense amplifier.

* * * * *